United States Patent
Agrawal

(10) Patent No.: US 7,180,819 B1
(45) Date of Patent: Feb. 20, 2007

(54) CONVERTING DUAL PORT MEMORY INTO 2 SINGLE PORT MEMORIES

(75) Inventor: Ghasi R. Agrawal, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/243,622

(22) Filed: Oct. 4, 2005

(51) Int. Cl.
*G11C 8/00* (2006.01)

(52) U.S. Cl. .......................... 365/230.05; 365/189.04; 365/154

(58) Field of Classification Search ........... 365/230.05, 365/230.06, 230.03, 189.03, 189.04, 154, 365/156
See application file for complete search history.

(56) References Cited

U.S. PATENT DOCUMENTS

| 4,646,266 | A * | 2/1987 | Ovshinsky et al. ......... 365/105 |
| 6,597,594 | B2 * | 7/2003 | Waller ......................... 365/49 |
| 6,788,613 | B1 * | 9/2004 | Gratrex et al. ......... 365/230.05 |
| 2005/0117436 | A1 * | 6/2005 | Cox ....................... 365/230.03 |

* cited by examiner

*Primary Examiner*—Gene A. Auduong
(74) *Attorney, Agent, or Firm*—Ortiz and Lopez, PL

(57) ABSTRACT

A circuit is configured as a splittable duplex memory cell or as a joinable single port memory pair based on the state of a programming layer. The programming layer has two states. In one state, the programming layer configures the circuit as a joinable single port memory pair. In the other state it configures the circuit as a splittable duplex memory cell. As such, the circuit can act as either a dual port memory cell or as two single port memory cells.

20 Claims, 3 Drawing Sheets

CONVERTING DUAL PORT MEMORY INTO 2 SINGLE PORT MEMORIES

TECHNICAL FIELD

Embodiments are generally related to dual port memories, single port memories, and programmable logic. Embodiments are also related to using programmable logic to cause a circuit to act as a dual port memory or as two single port memories.

BACKGROUND OF THE INVENTION

Programmable logic is a type of logic that can be programmed at the circuit level. This is in contrast to application specific logic. Application specific logic is a circuit or grouping of circuits that is specifically designed to perform a certain function. A circuit can be implemented using either application specific logic or using programmable logic. In general, implementing a circuit using application specific logic has larger non-recoverable engineering (NRE) costs. NRE costs are those costs incurred in preparing to manufacture a product such as design and compliance testing. A solution using programmable logic, however, often has higher manufacturing costs. As such, high volume products often use application specific circuits while lower volume products use programmable logic. Programmable logic is also popular in products designed to be easily upgraded.

A programmable logic chip can be programmed at the circuit level because it has a programmable layer connecting functional units. A functional unit is a circuit implementing a defined function that can range from simple logic gates to arithmetic units. Those skilled in the arts of electronic product design or digital circuit design are familiar with many types of programmable logic including those using fusible elements, volatile elements, nonvolatile elements, erasable nonvolatile elements, and conductive films such as metal or polysilicon.

A fusible element is programmed by breaking an electrical connection between two points. Instead of breaking an electrical connection, other solutions control the state of the electrical connection. For example, a transistor can control an electrical connection. If the transistor is conducting, the two points appear to be electrically connected. If the transistor is not conducting, the two points appear to be electrically disconnected. A memory cell can control the transistor. Nonvolatile memory retains a value with or without power; these devices can be programmed once and trusted to keep their programming. Volatile memory can not retain a value unless it receives power; these devices must be programmed every time power is applied. Finally, some nonvolatile can be erased and programmed again.

In choosing to use application specific logic or programmable logic, the total cost per unit is evaluated. For example, an application specific solution has $100 NRE and a $1 per unit manufacturing cost while a programmable logic solution has $50 NRE and $2 per unit manufacturing cost. If the expected production is 10 units then programmable logic is better. If the expected production is 100 units, then application specific logic is better. Producers of programmable logic are always seeking ways to reduce the per unit manufacturing cost.

One way to reduce per unit manufacturing cost is to offer a programmable logic product that can be used in a great number of different solutions. One way to accomplish this is by using configurable on-chip memory. An on chip-memory is a collection of volatile memory cells on a semiconductor chip. On-chip memory can have many properties.

Two of the possible properties are single port or dual port. A single port memory cell has a single port through which the chip is accessed while a dual port memory cell has two.

FIG. 2, labeled as "prior art" illustrates a single port memory cell. The value stored in a memory cell 201 can be read by raising the voltage of a read/write line 206 which causes a first transistor 205 to pass voltage to a first wire 202 and causes a second transistor 204 to pass voltage to a second wire 203. Based on the memory cell shown, the wires 202, 203 have complementary voltages meaning there will be a high voltage on one wire and a low voltage on the other. A value can be stored in the memory cell by placing complementary voltages on the wires and raising the voltage of the read/write wire 206. The memory cell illustrated is a static random access memory cell. The memory cell is accessed through a single port. Transistors 204, 205 and wires 202, 203, and 206 are part of the single port.

Those practiced in the art of digital design or random access memories are familiar with the single port memory illustrated in FIG. 2 as well as a variety of other circuits and implementations of single port memories. The prior art single port memory is intended to illustrate the concept of a port and a memory cell. Neither FIG. 2, nor any other figure, is intended as a limitation to a specific type of memory cell or port.

FIG. 3, labeled as "prior art", illustrates a dual port memory. The dual port memory contains the memory cell 201 and the port of the single port memory of FIG. 2 as a first port. A second port, however, has been added. The second port has a second read/write wire 301, a third transistor 302 passing voltage to a third wire 304, and a fourth transistor 303 passing voltage to a fourth wire 305. The operation and use of the second port is similar to that of the first port discussed above as part of the single port memory. FIG. 3 is also not intended as a limitation, but is intended to introduce the concept of a second port. Those practiced in the art of digital design or random access memories are familiar with the dual port memory illustrated in FIG. 3 as well as many other designs and implementations.

As discussed above, programmable logic chips often contain memory. Some programmable logic chips contain dual port memory that can be configured as a single port memory. These chips accomplish the configuration by disabling one of the ports to the dual port memory. Returning to FIG. 3, removing the second port results in the circuit illustrated in FIG. 2. The problem with this reconfiguration solution, as those practiced in the art of integrated circuit design know, is that wires are expensive because they take up space. Disabling the second port results in wasted wires and a lot of wasted space. The cost of an integrated circuit can be approximated by how much space it uses. There is a need for a reconfigurable dual port memory that does not result in the waste of so much wiring space.

BRIEF SUMMARY

Aspects of the embodiments address limitations and flaws in the prior art by adding a programming layer and a second memory cell to the dual port memory design such that a splittable duplex memory cell, a joinable single port memory pair, and a splittable dual memory cell are formed.

It is therefore an aspect of the embodiments to provide a programming layer and a duplex memory cell. The duplex memory cell and the programming layer are electrically connected to form a splittable duplex memory cell. The splittable duplex memory cell is electrically connected to a first port and a second port to form a splittable dual port memory cell.

It is also an aspect of the embodiments that the transistors comprising the splittable dual port memory cell have insulated gates. CMOS transistors have insulated gates and are produced using a CMOS semiconductor process. Those practiced in the art of semiconductor manufacturing are familiar with other materials that can be used to produce transistors for use in a splittable dual port memory cell such as Silicon-Germanium transistors, and Gallium-Arsenide transistors.

It is an additional aspect of the embodiments that the programming layer can be in one of two states. The two states are splitting and joining. In the splitting state, the programming layer does not conduct electrical current or pass electrical voltage while in the joining state it does. As discussed above, programming layers can be produced with fusible elements, elements based on a volatile memory cell, elements based on a nonvolatile memory cell, or elements based on conductive films such as metal or polysilicon.

BRIEF DESCRIPTION OF THE DRAWINGS

The accompanying figures, in which like reference numerals refer to identical or functionally similar elements throughout the separate views and which are incorporated in and form a part of the specification, further illustrate the present invention and, together with the background of the invention, brief summary of the invention, and detailed description of the invention, serve to explain the principles of the present invention.

DETAILED DESCRIPTION OF THE INVENTION

The particular values and configurations discussed in these non-limiting examples can be varied and are cited merely to illustrate embodiments and are not intended to limit the scope of the invention.

Figure 1:
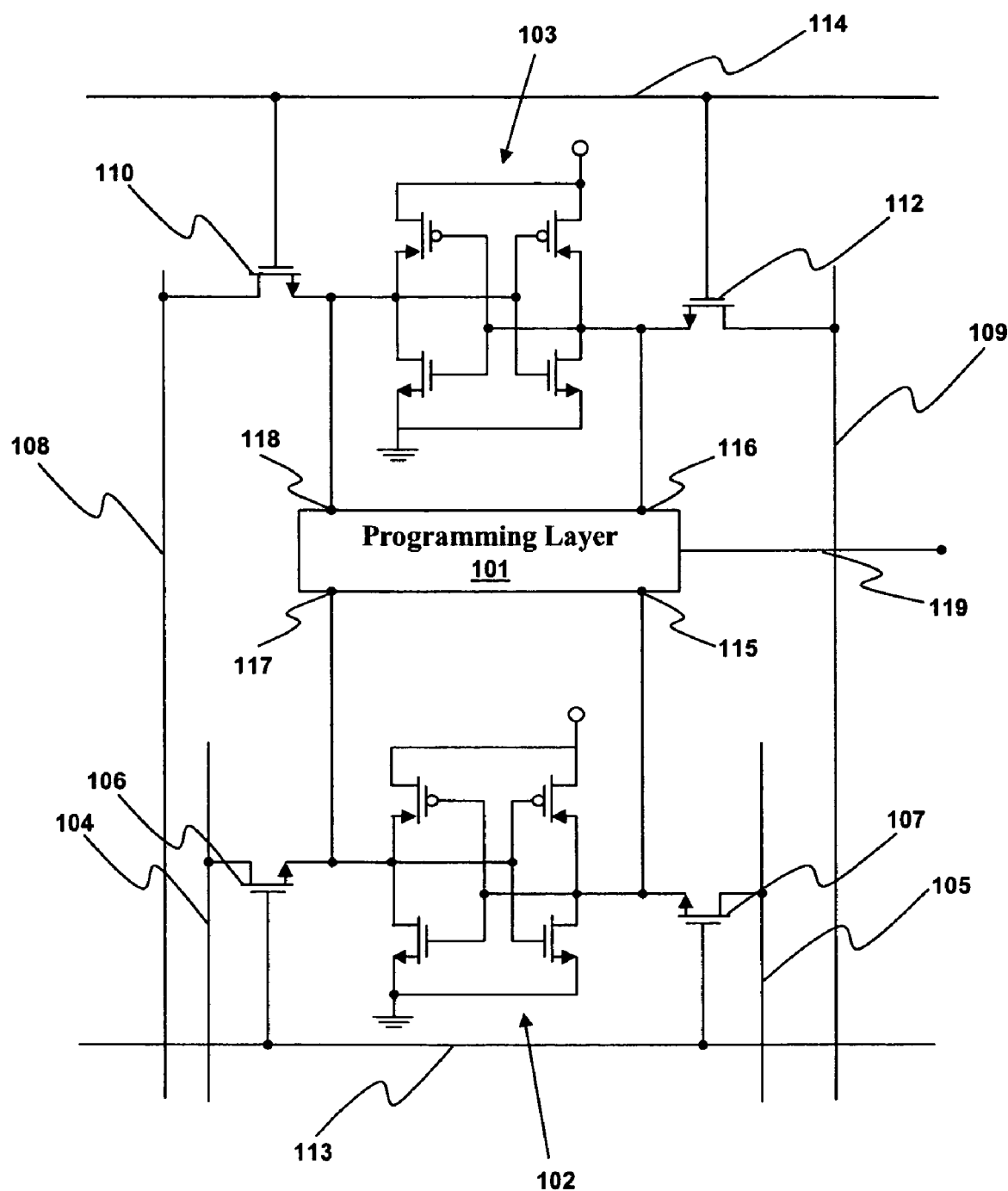
FIG. 1 illustrates a circuit that can be configured as a splittable duplex memory cell or as a joinable single port memory pair based on the state of a programming layer in accordance with aspects of certain embodiments.

FIG. 1 illustrates a circuit that can be configured as a splittable duplex memory cell or as a joinable single port memory pair based on the state of a programming layer 101 in accordance with aspects of certain embodiments. The programming layer 101 has two states. In the isolating state the programming layer isolates node 1 115 from node 2 116 and isolates node 3 117 from node 4 118. In the non-isolating state, the programming layer 101 passes signals between node 1 115 to node 2 116 and between node 3 117 and node 4 118. The state of the programming layer 101 can be set using a programming input 119 if the programming layer is programmable by such an input. Those skilled in the art of programmable devices are aware that some programming layers require a programming while others do not.

Figure 2:
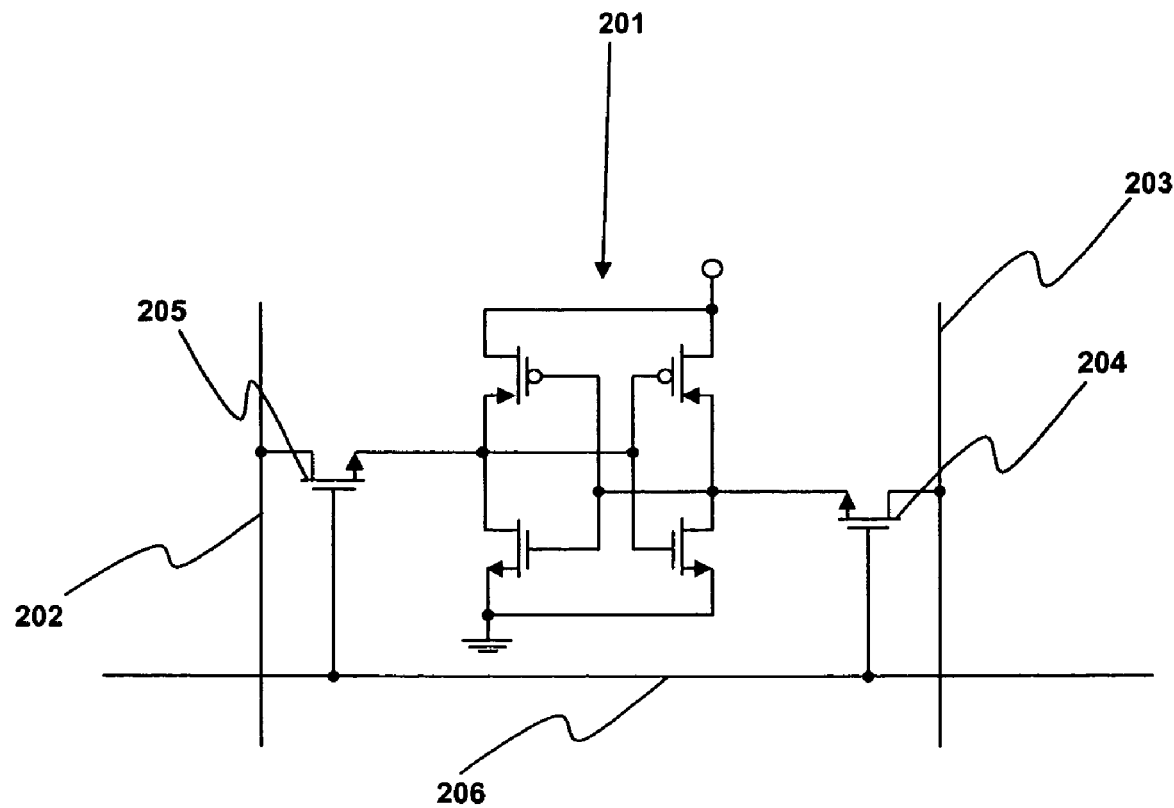
FIG. 2, labeled as "prior art" illustrates a single port memory cell.
Figure 3:
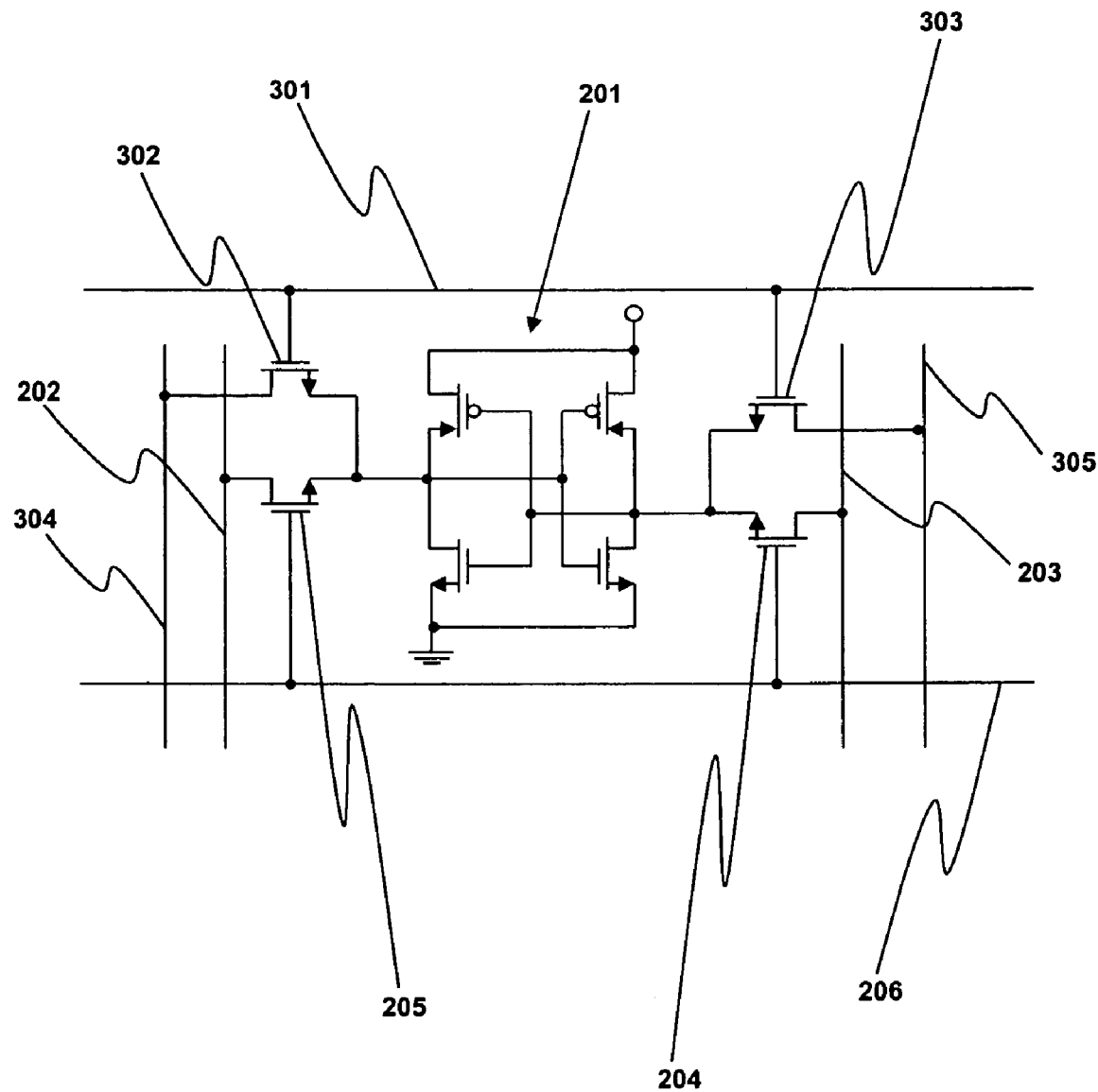
FIG. 3, labeled as "prior art", illustrates a dual port memory.

Comparing FIG. 1 to FIG. 2, it is obvious that the circuit illustrated in FIG. 1 includes two single port memory cells that are in joinable single port memory pair because they can be joined by the programming layer.

When the programming layer is in the isolating state, the two single port memory cells are functionally isolated. The value stored in the lower memory cell 102 can be read by raising the voltage of a lower read/write line 113 which causes a first transistor 107 to pass voltage to a first wire 105 and causes a second transistor 106 to pass voltage to a second wire 104. Similarly, the value stored in the upper memory cell 103 can be read by raising the voltage of an upper read/write line 114 which causes a third transistor 110 to pass voltage to a third wire 108 and causes a fourth transistor 112 to pass voltage to a fourth wire 109. Values can also be written to the upper memory cell 103 and the lower memory cell 102 using signaling similar to that discussed above in reference to the single port memory of FIG. 2.

When the programming layer is in the non-isolating state, the collectors of the first transistor 107 and the fourth transistor 112 are electrically connected through the programming layer. The collectors of the second transistor 106 and the third transistor 110 are also electrically connected through the programming layer. Connecting the collectors in such a manner causes the upper memory cell 103 and the lower memory cell 102 to behave as if they both have a single memory cell. As such, the upper memory cell 103, the lower memory cell 102 and the programming layer form a splittable duplex memory cell because the programming layer can isolate the memory cells from one another.

The value stored in the splittable duplex memory cell can be read by raising the voltage of a lower read/write line 113 which causes a first transistor 107 to pass voltage to a first wire 105 and causes a second transistor 106 to pass voltage to a second wire 104. The value stored in the splittable duplex memory cell can also be read by raising the voltage of an upper read/write line 114 which causes a third transistor 110 to pass voltage to a third wire 108 and causes a fourth transistor 112 to pass voltage to a fourth wire 109. As such, when the programming layer 101 is in the non-isolating state the splittable dual port memory cell acts the same as a dual port memory cell.

Those skilled in the art of digital design are familiar with dual port memory circuits, on appreciation of the information disclosed herein realize the ease with which values can be read from and written into the memory cells 102, 103 when the circuit illustrated in FIG. 1 when it is configured as a splittable dual port memory cell or when it is configured as a joinable single port memory pair. Furthermore, they realize that the information can be equivalently applied to other memory cell designs such as the single transistor memory cells used in dynamic random access memories.

Embodiments can be implemented in the context of modules. In the computer programming arts, a module can be typically implemented as a collection of routines and data structures that performs particular tasks or implements a particular abstract data type. Modules generally can be composed of two parts. First, a software module may list the constants, data types, variable, routines and the like that can be accessed by other modules or routines. Second, a software module can be configured as an implementation, which can be private (i.e., accessible perhaps only to the module), and that contains the source code that actually implements the routines or subroutines upon which the module is based. Thus, for example, the term module, as utilized herein generally refers to software modules, hardware modules, or implementations thereof. Such modules can be utilized separately or together to form a program product that can be implemented through signal-bearing media, including transmission media and recordable media.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system comprising:
   a programming layer and a duplex memory cell comprising at least eight transistors comprising at least four enhancement mode transistors and at least four depletion mode transistors wherein the eight transistors and the programming layer are electrically connected to form a splittable duplex memory cell; and
   a first port and a second port electrically connected to the splittable duplex memory cell to form a splittable dual port memory cell.

2. The system of claim 1 wherein at least one of the eight transistors has an insulated gate.

3. The system of claim 1 wherein at least one of the at least eight transistors is a CMOS transistor.

4. The system of claim 1 wherein at least one of the at least eight transistors is a Silicon-Germanium transistor.

5. The system of claim 1 wherein at least one of the at least eight transistors is a Gallium-Arsenide transistor.

6. The system of claim 1 wherein the programming layer comprises at least one fusible element.

7. The system of claim 1 wherein the programming layer comprises at least one volatile memory cell.

8. The system of claim 1 wherein the programming layer comprises at least erasable nonvolatile memory cell.

9. A system comprising:
   a first memory cell and a first port electrically connected to form a first single port memory cell;
   a second memory cell and a second port electrically connected to form a second single port memory cell; and
   a programming layer electrically connected to the first single port memory cell and to the second single port memory cell to form a joinable single port memory cell pair.

10. The system of claim 9 wherein the first memory cell, second memory cell, or the programming layer comprises at least one transistor having an insulated gate.

11. The system of claim 9 wherein the first memory cell, second memory cell, or the programming layer comprises at least one CMOS transistor.

12. The system of claim 9 wherein the first memory cell, second memory cell, or the programming layer comprises at least one Silicon-Germanium transistor.

13. The system of claim 9 wherein the first memory cell, second memory cell, or the programming layer comprises at least one Gallium-Arsenide transistor.

14. The system of claim 9 wherein the programming layer comprises at least one fusible element.

15. The system of claim 9 wherein the programming layer comprises at least one volatile memory cell.

16. The system of claim 9 wherein the programming layer comprises at least erasable nonvolatile memory cell.

17. A method comprising:
   supplying a first single port memory comprising a first memory cell and a first port;
   supplying a second single port memory comprising a second memory cell and a second port; and
   supplying a programming layer electrically connected to the first memory cell and the second memory cell thereby forming a splittable dual memory cell when the programming layer is in a first state and forming a joinable single port memory cell pair when the programming layer is in a second state.

18. The method of claim 17 further comprising placing the programming layer in the first state.

19. The method of claim 17 further comprising placing the programming layer in the second state.

20. The method of claim 17 further comprising using a CMOS semiconductor process to produce the first single port memory, second single port memory are supplied.

* * * * *